(12) United States Patent
Peng et al.

(10) Patent No.: US 8,116,119 B1
(45) Date of Patent: Feb. 14, 2012

(54) DESENSITIZING STATIC RANDOM ACCESS MEMORY (SRAM) TO PROCESS VARIATIONS

(75) Inventors: Tao Peng, Santa Clara, CA (US); Hsiao Hui Chen, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 53 days.

(21) Appl. No.: 12/758,579

(22) Filed: Apr. 12, 2010

Related U.S. Application Data

(62) Division of application No. 11/899,825, filed on Sep. 7, 2007, now Pat. No. 7,746,717.

(51) Int. Cl.
*G11C 11/00* (2006.01)

(52) U.S. Cl. ...... 365/154; 257/903; 365/156; 365/210.1

(58) Field of Classification Search .................. 257/903; 365/154, 156, 210.1
See application file for complete search history.

(56) References Cited

U.S. PATENT DOCUMENTS

| | | | |
|---|---|---|---|
| 4,792,928 A | 12/1988 | Tobita | |
| 5,268,869 A * | 12/1993 | Ferris et al. | 365/205 |
| 5,473,568 A | 12/1995 | Okamura | |
| 5,596,539 A | 1/1997 | Passow et al. | |
| 5,910,924 A | 6/1999 | Tanaka et al. | |
| 6,181,640 B1 | 1/2001 | Kang | |
| 6,285,604 B1 | 9/2001 | Chang | |
| 6,353,569 B1 | 3/2002 | Mizuno et al. | |
| 6,690,608 B2 | 2/2004 | Nii et al. | |
| 6,711,086 B2 * | 3/2004 | Terada | 365/230.05 |
| 7,440,312 B2 * | 10/2008 | Hollis et al. | 365/154 |
| 7,746,717 B1 * | 6/2010 | Peng et al. | 365/210.1 |

* cited by examiner

*Primary Examiner* — Alexander Sofocleous
(74) *Attorney, Agent, or Firm* — Kevin T. Cuenot

(57) ABSTRACT

A static random access memory (SRAM) can include a plurality of columns forming a memory array, wherein each column comprises a plurality of memory cells coupled to bitlines and wordlines, and a write replica circuit generating a signal when data has been written to the write replica circuit. A wordline of the memory array is turned off responsive to the signal. The write replica circuit can include an additional column comprising at least one dual port dummy memory cell, and write detection circuitry coupled to the dual port dummy memory cell detecting when data has been written to the dual port dummy memory cell and responsively generating the signal. The signal generated by the write detection circuitry indicates a successful write operation to the dual port dummy memory cell.

19 Claims, 4 Drawing Sheets

DESENSITIZING STATIC RANDOM ACCESS MEMORY (SRAM) TO PROCESS VARIATIONS

FIELD OF THE INVENTION

The embodiments disclosed herein relate to integrated circuit devices. More particularly, the embodiments relate to static random access memory devices.

BACKGROUND

Static random access memory (SRAM) is a type of memory that does not require refreshing, for example, as compared to dynamic random access memory. Assuming that power to the SRAM is maintained, data can be stored within the memory cells of an SRAM indefinitely.

Modern SRAMs operate at very high clock rates and have very high densities. This makes SRAMs susceptible to process variations. "Process variations" refer to the situation in which seemingly identical integrated circuits (ICs) exhibit different characteristics. Process variations occur, or are introduced, during fabrication of the IC. Process variations, as the phrase suggests, can vary from wafer to wafer, die to die, and even from device to device within the same neighborhood. These variations can affect timing of any circuitry implemented upon the wafer. For example, due to process variations, the timing characteristics of one cell of an SRAM may vary from the timing characteristics of another cell in the same SRAM, taken from the same wafer and same die.

Process variations can be classified in terms of different "process corners." In general, a "process corner" characterizes behavior, e.g., speed, of PMOS transistors and NMOS transistors with respect to the wafer. For example, possible process corners include (fast-P, fast-N), (slow-N, fast-N), (fast-P, slow-N), and (slow-P, slow-N), where "P" represents a PMOS transistor and "N" represents an NMOS transistor. Process corners also may be denoted also as FF (fast-P, fast-N), SF (slow-N, fast-P), etc. Transistor performance also can be characterized as typical, for example, where a "typical typical" process corner is denoted as "TT."

SRAMs often are designed with relaxed timing tolerances so that the functionality of the SRAM is not compromised in consequence of a particular processing variation. Accordingly, SRAMs typically operate at reduced speeds to account for the range of possible processing variations that may apply. In other words, the SRAM is designed with larger timing tolerances so that the SRAM will function properly despite being affected, or characterized, by a particular process corner. Loosening of tolerances can reduce overall circuit performance, but can increase yield.

SUMMARY

The embodiments disclosed herein relate to static random access memories (SRAMs). One embodiment of the present invention can include an SRAM including an array of memory cells. Each memory cell can be coupled to one of a plurality of sense amplifiers through a bitline. The SRAM also can include replica bitline circuitry including a replica bitline coupled to a replica bitline amplifier. The replica bitline amplifier can provide a strobe signal to the plurality of sense amplifiers, wherein the replica bitline amplifier includes a feedback path.

An input of the replica bitline amplifier can be coupled to the replica bitline and an output of the replica bitline amplifier can be coupled to the plurality of sense amplifiers. The feedback path can feed a signal back to the input of the replica bitline amplifier.

The replica bitline amplifier can include a first amplification stage coupled to the replica bitline and a second amplification stage. An input of the second amplification stage can be coupled to an output of the first amplification stage and an output of the second amplification stage can be coupled to the plurality of sense amplifiers. The feedback path can couple an output of the first amplification stage to the input of the first amplification stage.

The first amplification stage can be implemented as an inverter. The second amplification stage can be implemented as an inverter. In one embodiment, the feedback path can include a PMOS transistor. For example, a gate of the PMOS transistor can be coupled to the output of the first amplification stage. A source of the PMOS transistor can be coupled to a supply voltage. A drain of the PMOS transistor can be coupled to an input of the first amplification stage.

Another embodiment of the present invention can include an SRAM having a plurality of columns forming a memory array. Each column can include a plurality of memory cells coupled to bitlines and wordlines. The SRAM can include a write replica circuit generating a signal when data has been written to the write replica circuit. A wordline of the memory array can be turned off responsive to the signal.

The write replica circuit can include an additional column having at least one dual port dummy memory cell, or a plurality of dual port dummy memory cells, and write detection circuitry coupled to the dual port dummy memory cell(s). The write detection circuitry can detect when data has been written to the dual port dummy memory cell and responsively generate the signal. The signal generated by the write detection circuitry can indicate a successful write operation to the dual port dummy memory cell.

The additional column can include at least one dual port off memory cell. In one embodiment, a total number of dual port dummy memory cells and dual port off memory cells within the additional column can be equivalent to a number of memory cells in one of the plurality of columns of the memory array.

The write detection circuitry can include a toggle flip flop. The toggle flip flop can include first and second outputs and receive an access signal. The toggle flip flop can provide a first output signal from the first output to write driver circuitry for a first bitline of a first port of the dual port dummy memory cell. The toggle flip flop further can provide a second output signal from the second output to write driver circuitry for a second bitline of the first port of the dual port dummy memory cell.

The write detection circuitry can include a multiplexer coupled to the first bitline and a second bitline of a second port of the dual port dummy memory cell. The multiplexer can be enabled according to the first output of the toggle flip flop. Signals from the first bitline and the second bitline of the second port of the dual port dummy memory cell can be inverted prior to being provided to the multiplexer. The first output of the toggle flip flop is not complemented. The second output of the toggle flip flop can be complemented.

Data can be written to the dual port dummy memory cell by alternating between pulling down the first bitline of the first port and pulling down the second bitline of the first port on consecutive write cycles. The plurality of columns and the write replica circuit can share a common process variation.

Another embodiment of the present invention can include a method of predicting a completed write operation within an SRAM. The method can include providing at least one dual port dummy memory cell within an additional column of a memory array of the static random access memory and writing data to the dual port dummy memory cell by alternating between pulling down a first bitline of a first port of the dual port dummy memory cell and pulling down a second bitline of the first port on consecutive write cycles.

A transition in at least one of a first bitline or a second bitline of a second port of the dual port dummy memory cell can be detected. A wordline of the SRAM can be turned off responsive to the detection.

DETAILED DESCRIPTION

Figure 1:
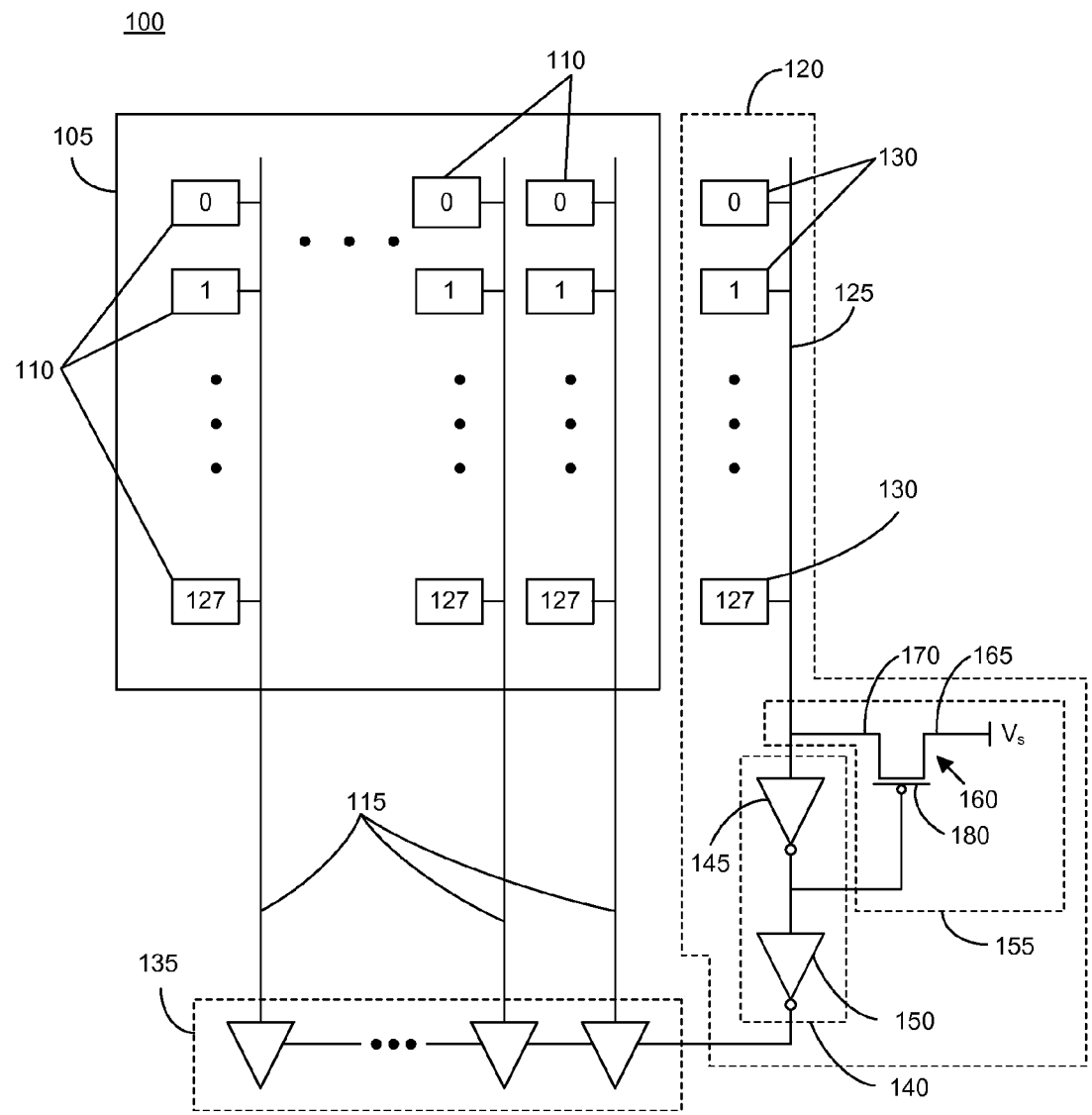
FIG. 1 is a schematic diagram illustrating a static random access memory (SRAM) in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention. In the present specification, the same reference characters are used to refer to terminals, signal lines, wires, and their corresponding signals.

FIG. 1 is a schematic diagram illustrating a static random access memory (SRAM) 100 in accordance with one embodiment of the present invention. As shown, the SRAM 100 can include a memory array 105, replica bitline circuitry 120, and a plurality of sense amplifiers 135.

The memory array 105 can include a plurality of memory cells 110 arranged in rows and columns as shown. Each of the memory cells 110 can be accessed, e.g., read from or written to, via bitline circuitry 115 and wordline circuitry (not shown) as is well known to the skilled artisan. For purposes of illustration and clarity, only bitline circuitry 115 is represented in FIG. 1. Further, those skilled in the art will appreciate that the differential nature of the bitline circuitry is represented within FIG. 1 as a single line rather than as two signal paths from which voltage differentials are detected by the sense amplifiers 135.

The replica bitline circuitry 120 is effectively a "dummy" bitline column. That is, the replica bitline circuitry 120 does not receive data for storage nor does the replica bitline circuitry 120 output data that is stored therein. The replica bitline circuitry 120 is intended to track the pulldown action of the bitlines 115 within the memory array 105. By tracking the pulldown of bitlines 115 of the memory array 105, the sense amplifiers 135 can be strobed, e.g., enabled, using a signal generated by the replica bitline circuitry 120. The signal used to strobe the sense amplifiers 135 can be taken from an output of a replica bitline amplifier 140, to be described herein in greater detail. Enabling the sense amplifiers 135 from a signal taken from the output of the replica bitline circuitry 120 provides improved performance. For example, without the replica bitline circuitry 120, the sense amplifiers 135 are typically turned on earlier than is required for operation in the SRAM 100. The may lead to the sense amplifiers 135 outputting incorrect or wrong storage information.

The replica bitline circuitry 120 can include a replica bitline 125 that typically is loaded with a plurality of memory cells 130 containing a "1" or a "0" value. For example, in an embodiment in which each bitline 115 of the memory array 105 has 128 memory cells 110, the replica bitline circuitry 120 can have approximately 21 active memory cells. An "active memory cell" refers to a memory cell in which the word line is not tied to ground as opposed to other memory cells in the same column in which the word line is tied to ground. Varying the number of active memory cells can result in a more reasonable slew rate with respect to bitline pulldown. The memory cells 130 function as a load on the replica bitline 125. Loading the replica bitline 125 with a particular number of memory cells 130 results in a slew rate for the replica bitline 125 that is proportional the slew rate of the bitlines 115 of the memory array 105. As known, the slew rate of a given signal defines a maximum rate at which the voltage of that signal, or line, can change over time.

The replica bitline circuitry 120 further can include a replica bitline amplifier 140. Since the slew rate of the replica bitline 125 is slow compared to typical CMOS digital circuit operation, the replica bitline 125 can be followed by the replica bitline amplifier 140. For example, the slew rate of the replica bitline 125 may be on the order of approximately 0.6 V/ns. Accordingly, the replica bitline amplifier 140 can provide sufficient drive to quickly enable the sense amplifiers 135. As pictured, the replica bitline amplifier 140 can include multiple stages, e.g., a first amplification stage 145 and a second amplification stage 150. In one embodiment, the first amplification stage 145 can be implemented as an inverter. Similarly, the second amplification stage 150 can be implemented as an inverter.

Within the memory array 105, the bitlines 115 are pulled down by the NMOS transistors within the memory cells 110. With respect to the replica bitline circuitry 120, the first half of the timing is NMOS transistor dominated. The second half, for example, the first amplification stage 145, is dominated by PMOS transistors. The PMOS transistor timing characteristics introduced by the first amplification stage 145 can cause a mismatch in terms of slew rate between the bitlines 115 and the replica bitline 125. This is further exacerbated at process corners such as slow-N, fast-P.

In illustration, the sense amplifiers 135 are enabled when the strobe signal provided from the output of the replica bitline amplifier 140 goes high. To correctly sense the content of memory cell(s) 110, a minimum voltage differential on the bitline(s) 115 is needed. If the strobe signal from the replica bitline circuitry 120 is not provided at the correct time, a functional failure within the SRAM 100 may occur. Within IC fabrication processes, a skew, in terms of when the sense amplifiers 135 are turned on, of up to several standard deviations is usually needed to obtain adequate yield. To account for the slow-N, fast-P process corner case, performance of the SRAM 100 is generally reduced to ensure proper operation. Thus, the mismatch that occurs between the bitlines 115 and the replica bitline circuitry 120 typically results in a tradeoff where circuit performance is sacrificed for higher yield.

A feedback path 155 can be added to the replica bitline circuitry 120 and, more particularly, to the replica bitline amplifier 140. As shown, an output signal of the first amplification stage 145 can be taken and fed back to an input of the first amplification stage 145. In one embodiment, the feedback path 155 can be implemented as a PMOS transistor 160. In such an embodiment, a source 165 of the PMOS transistor 160 can be coupled to the supply voltage. A drain 170 of the PMOS transistor can be coupled to the input of the first amplification stage 145. A gate 180 of the PMOS transistor 160 can be coupled to the output of the first amplification stage 145 (and thus the input of the second amplification stage 150).

The addition of the feedback path 155 allows the replica bitline circuitry 120 to better track pulldown behavior of the bitlines 115 across a wide range of process corners. This is particularly true with respect to the skewed process corner in reference to (slow-N, fast-P) and (fast-P, slow-N). The feedback path 155 can result in a more constant bitline split in terms of voltage differential as the sense amplifiers 135 are turned on or enabled.

In general, the feedback path 155 can operate against the PMOS transistor(s) of the first amplification stage 145, e.g., an inverter, while helping the NMOS transistor(s) within the first amplification stage 145. In this regard, the feedback path 155 can effectively neutralize the effects of the slow-N, fast-P process corner. More particularly, the PMOS transistor 160 can cancel out the timing effects of the PMOS transistor(s) within the inverter and strengthen timing effects of the NMOS transistor(s) of the inverter. Thus, at the slow-N, fast-P process corner, the fast PMOS transistor(s) will be weakened, thereby de-sensitizing the SRAM 100 to process variations.

Figure 2:
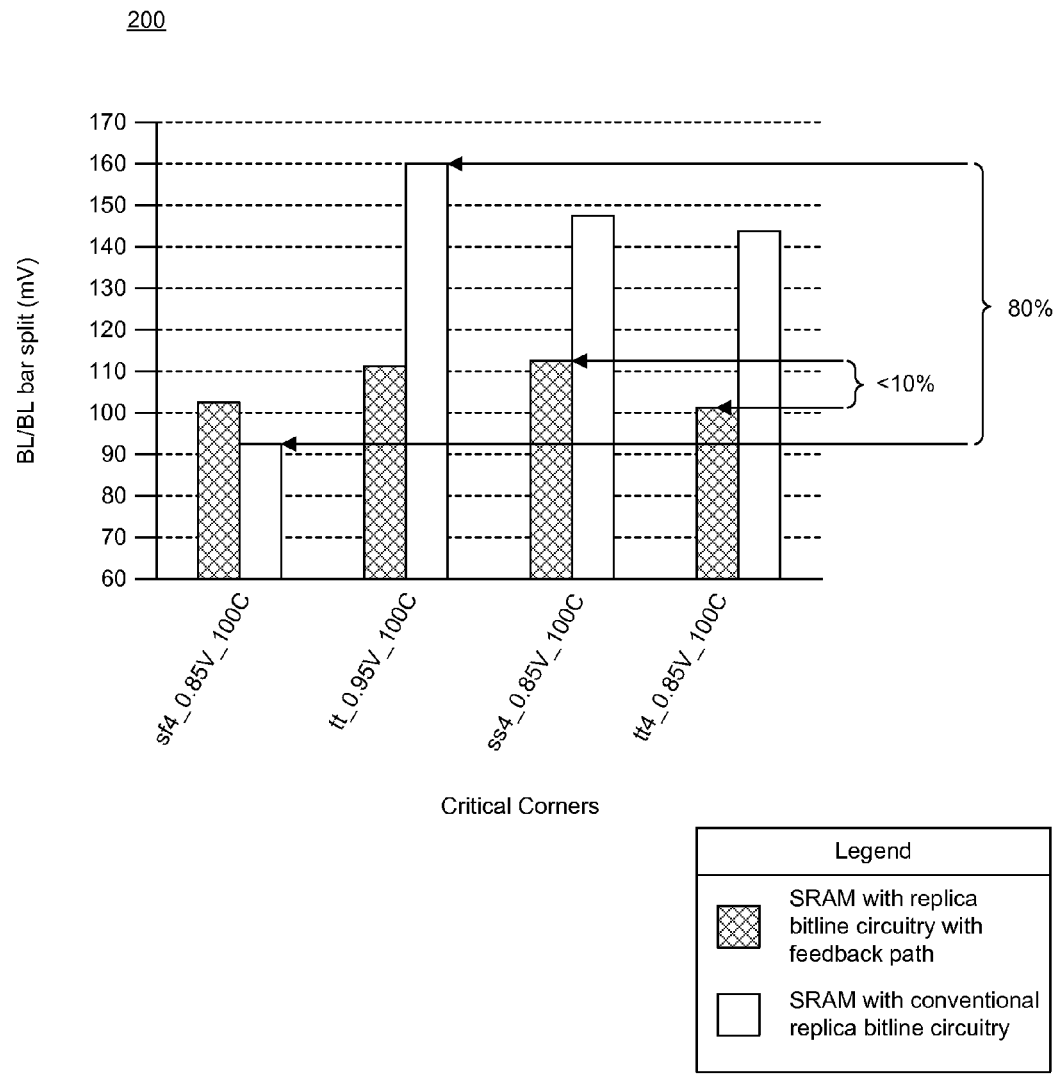
FIG. 2 is a graph illustrating behavioral aspects of the SRAM of FIG. 1.

FIG. 2 is a graph 200 illustrating behavioral aspects of the SRAM of FIG. 1. Graph 200 presents testing results comparing the bitline voltage differential for several different process corners. Results for SRAMs with conventional replica bitline circuitry and SRAMs with replica bitline circuitry having a feedback path as described herein are shown. From a review of graph 200, one can see that the bitline voltage differential of the replica bitline circuitry including the feedback path has a variation of less than approximately 10% among the process corners shown. The SRAM having conventional replica bitline circuitry exhibits a voltage differential on the replica bitline which varies by approximately 80% among the process corners shown. The more constant voltage differential obtained on the replica bitline circuitry across process corners can translate into improved circuit performance of approximately 90 picoseconds. The sense amplifiers can be enabled with a timing that is more constant across different process corners.

Figure 3:
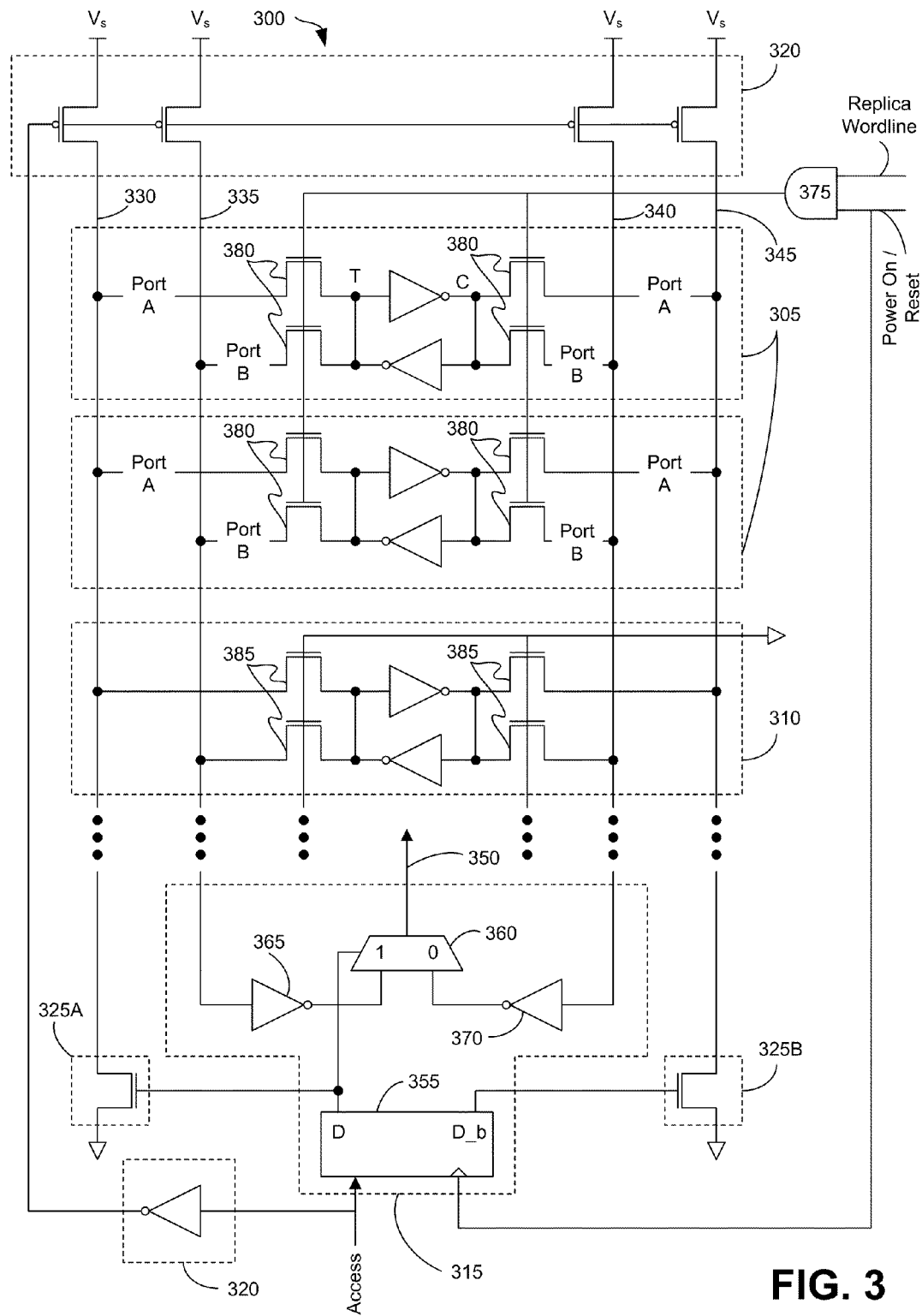
FIG. 3 is a schematic diagram illustrating a portion of an SRAM in accordance with an embodiment of the present invention.

FIG. 3 is a schematic diagram illustrating a portion of an SRAM in accordance with another embodiment of the present invention. FIG. 3 illustrates a column 300 of dual port memory cells that can be included within an SRAM. Column 300 includes one or more dual port dummy memory cells (dummy memory cells) 305, one or more dual port off memory cells (off memory cells) 310, and write detection circuitry 315. Column 300 further can include pre-charge circuitry 320 and write driver circuitry 325 comprised of write driver circuitry 325A and 325B (collectively referred to as "write driver circuitry 325").

Within conventional SRAMs, write completion into memory cells is not detected. Accordingly, within conventional SRAMs, a delay is required between the time that write driver circuitry within the memory array turns on and the time that wordline(s) within the memory array are turned off. This delay is predetermined to be long enough to ensure that data is correctly written to the memory cells of the SRAM. Due to process variations, the amount of time needed to correctly write data to memory cells will vary from one SRAM to the next. The delay, therefore, must be large enough to ensure that data is correctly written across a wide range of process variations, including a worst case process corner. This often leads to a situation in which the delay that is needed to account for the worst case process corner is larger than the delay needed for other process corners.

In general, column 300 provides a dynamic mechanism through which the completion of write operations in the actual memory array of the SRAM can be estimated. As such, less margin may be used in terms of the size of the delay needed to account for a worst case process corner. This can lead to overall improvement in yield. Because column 300 is subject to the same process variations as the SRAM in which column 300 is included, a signal 350 generated by the write detection circuitry 315 can be used as a mechanism by which wordline(s) of the actual memory array can be dynamically turned off. That is, wordline(s) within the actual memory array of the SRAM can be turned off in response to a signal 350 rather than waiting the entire duration of a predetermined delay. Since any process corner affecting the SRAM will also affect column 300, any timing changes introduced into the SRAM by a process variation will be automatically accounted for by column 300.

Regarding FIG. 3, the pre-charge circuitry 320 can charge each of bitlines 330, 335, 340, and 345 to a voltage that is indicative of a logic high within the SRAM. In some cases, bitlines are pre-charged to a value of that is half the voltage of the supply, e.g., $V_s/2$, while in other cases the bitlines 335-345 can be charged to a value of Vs. In any case, the pre-charge circuitry 320 can charge the bitlines 330-345 to a predetermined voltage level prior to a write operation being performed in the dummy memory cell(s) 305. The write driver circuitry 325 can pull down the voltage of the bitlines 330 and 345. As shown, the write driver circuitry 325 is coupled to the write detection circuitry 315 and will be described herein in greater detail with respect to operation of column 300.

Pre-charge circuitry and driver circuitry are well known in the field of SRAMs. The pre-charge circuitry 320 and the write driver circuitry 325 disclosed herein have been provided for purposes of illustration and are not intended to suggest that any particular circuit configuration in terms of pre-charge circuitry or write driver circuitry must be used. Any suitable pre-charge and/or write driver circuit configuration may be used so long as interaction and/or coupling with the write detection circuitry 315 functions as described herein.

The dummy memory cells 305 are said to be "dummy" cells because actual data that is to be used by a system in which an SRAM is included is not placed into or read from the dummy memory cells 305. The dummy memory cells 305 provide a mechanism by which the completion of a write operation can be detected. As noted, column 300 will be subjected to the same process variations as the rest of the SRAM that includes column 300. When a write operation is determined to be complete within column 300, one can assume that the write operation within the actual memory cells of the SRAM including column 300 also will be finished.

The dummy memory cells 305 can be configured as dual port memory cells having a "port A" and a "port B". Port A of each dummy memory cell 305 is coupled to bitline 330 and bitline 345 as pictured. Port B of each dummy memory cell 305 is coupled to bitline 335 and 340 as pictured. It should be appreciated that while two dummy memory cells 305 are depicted in FIG. 3, that as few as one dummy memory cell 305 can be used or more than two dummy memory cells 305 can be used. In one embodiment, for example, four dummy memory cells 305 can be included or used within column 300. Fewer or more dual port dummy memory cells 305 can be included, for example, for capacitance matching purposes.

The off memory cell 310 can be coupled to bitlines 330-345 as shown. The gates of each transistors 385 of the off memory cell 310, however, can be coupled to ground. The inclusion of off memory cell 310 allows the loading of bitlines 330-345 to be varied. For example, loading characteristics, such as capacitance, of the bitlines 330-345 can be made to be similar to, or match, the loading characteristics of the bitlines within the actual memory array of the SRAM. The number of off memory cells 310 can be varied, e.g., increased, until the desired loading of the bitlines 330-345 is achieved. Accordingly, though one off memory cell 310 is pictured in FIG. 3, those skilled in the art will appreciate that further off memory cells 310 can be included in column 300 to achieve a desired loading of the bitlines 330-345. In one embodiment, the total number of dummy memory cells 305 and off memory cells 310 of column 300 can be equivalent to a number of memory cells in one of the plurality of columns within the actual memory array of the SRAM.

In another embodiment, only bitlines 330 and 345 can be coupled to the off memory cells 310. Bitlines 335 and 340 are not coupled to the off memory cells 310. In such an embodiment, write loading into the memory cell can be accurately modeled as loading write completion will be reduced. This can lead to faster detection of write completion.

The write detection circuitry 315, in general, monitors the voltage on each of bitlines 340 and 335. Responsive to determining that a write operation has completed, the write detection circuitry 315 can generate a signal 350. The write detection circuitry 315 can include a toggle flip flop (FF) 355, a multiplexer 360, and two inverters 365 and 370.

The write detection circuitry 315 can receive an access signal, e.g., provided to the FF 355, indicating that a write operation has been initiated in the actual memory array of the SRAM. The FF 355 can provide a data output signal as a control signal from an output of the FF 355, e.g., output "D," to the multiplexer 360 and to the write driver circuitry 325A. An inverted output signal from an inverted output of FF 355, e.g., output "D_b," can be provided to the write circuitry 325B. Bitline 335 can be coupled to inverter 365. Similarly, bitline 340 can be coupled to inverter 370. The output of each of inverters 365 and 370 can be coupled to an input of the multiplexer 360 as shown. The signal 350 that is output from the multiplexer 360 indicates that a write operation within the dummy memory cell(s) 305 has completed.

Within the dummy memory cell(s) 305, transistors 380 can be controlled and/or activated via a signal output from logic gate 375. As shown, logic gate 375 can receive two signals. A replica wordline signal and a power on/reset signal can be provided to the logic gate 375. As shown, the power on/reset signal is also provided to the FF 355 as a clock signal.

In operation, column 300 can, on each clock cycle, write data to the dummy memory cell(s) 305, and detect when the write operation is complete. Upon completion of the write operation, signal 350 can be generated. Signal 350 can be used to turn off the wordline(s) within the actual memory array of the SRAM including column 300.

Upon the power on/reset signal being received, a value of "1" can be written into node T of the dummy memory cell 305. A value of "0" can be written into node C of the dummy memory cell 305. At the end of the previous access cycle, as determined according to the access signal, bitlines 330, 335, 340, and 345 can be pre-charged high by the pre-charge circuitry 320.

At the start of a next, or current, write cycle, a value of "0" can be written to node T through port by pulling down bitline 330. At that point, node T will experience a high-to-low transition. The high-to-low transition leads to a high to-low transition on bitline 335. The inverter 365 of the write detection circuitry 315 can detect the high-to-low transition on bitline 335. Effectively, writes can be implemented on port A, while write completion can be detected via port B. The inverter 365 can drive a signal provided to the multiplexer 360, thereby generating signal 350 to turn off the wordline(s) of the actual memory array. The output of inverter 370 can remain low.

The next access cycle can begin, at which time a value of "1" can be written to node T of the same dummy memory cells 305. The value of "1" can be written to the node T via port A by pulling down the voltage on bitline 345. Accordingly, node C of the dummy memory cell 305 will have a high-to-low transition. The high-to-low transition leads to a high-to-low transition on bitline 340. The high-to-low transition on bitline 340 can be detected by inverter 370. The inverter 370 can drive a signal provided to the multiplexer 360, thereby generating signal 350 to turn off the wordline of the actual memory array. The output from inverter 370 will go high while the output of inverter 365 will remain low. Writing to the dummy memory cells 305 can continue as described by alternately writing data to nodes written to node T and node C. Ones and zeros can be written to the dummy memory cell 305 in an alternating manner from one write cycle to the next as described. During periods of time when bitlines 330-345 are pre-charged high, output of both inverters 365-370 will be low such that no signal 350 is provided, e.g., signal 350 is at a logic low.

Figure 4:
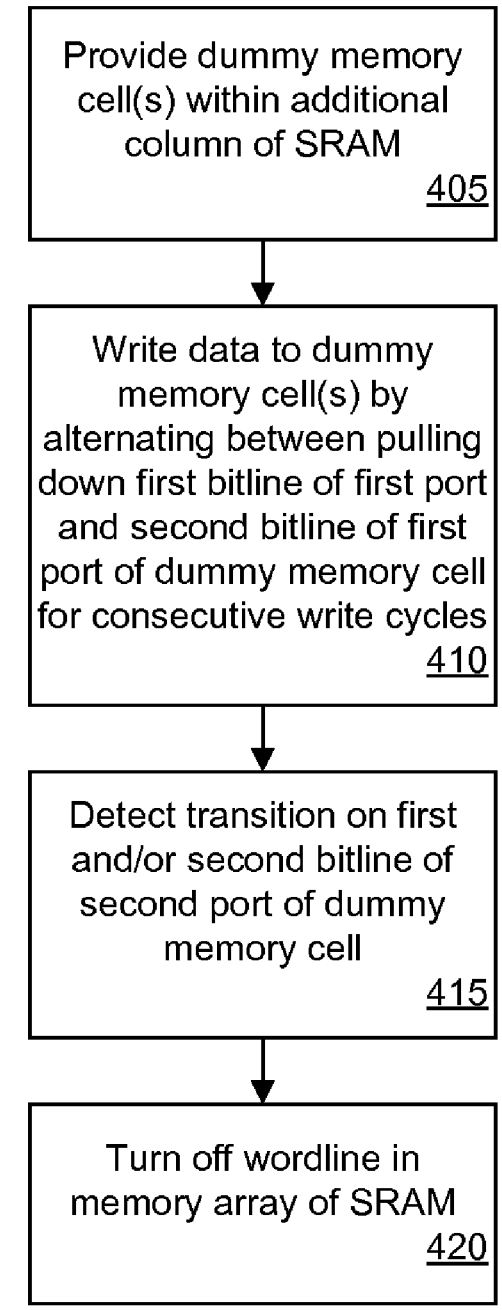
FIG. 4 is a flow chart illustrating a method of write detection in accordance with an embodiment of the present invention.

FIG. 4 is a flow chart illustrating a method 400 of write detection within an SRAM in accordance with another embodiment of the present invention. The method 400 can be implemented within an SRAM such as one configured to include a column as described with reference to FIG. 3. The method 400 can begin in step 405 where one or more dummy memory cells within an additional column of a memory array of an SRAM can be provided.

In step 410, data can be written to the dummy memory cells by alternating between pulling down a first bitline of a first port of the dual port dummy memory cell and pulling down a second bitline of the first port on consecutive write cycles. For example, on a first write cycle, a first bitline of port A of the dummy memory cell can be pulled down. On a next write cycle, a second bitline of port A can be pulled down. On successive write cycles, the first and second bitlines of port A can be pulled down in alternating fashion, such that alternating ones and zeros are written into the dummy memory cell(s) on each write cycle.

In step 415, a transition in at least one of a first bitline or a second bitline of a second port of the dual port dummy memory cell can be detected. For example, write completion can be detected on port B of the dummy memory cells through the transition of either the first bitline of port B and/or the second bitline of port B. In step 420, responsive to detecting a transition of a bitline of port B, e.g., detecting a write completion, a wordline of the SRAM can be turned off.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A static random access memory, comprising:
   a plurality of columns forming a memory array, wherein each column comprises a plurality of memory cells coupled to bitlines and wordlines; and
   a write replica circuit generating a signal when data has been written to the write replica circuit, wherein a wordline of the memory array is turned off responsive to the signal,
   wherein the write replica circuit comprises:
      an additional column comprising a dual port dummy memory cell comprising a first port having first and second bitlines and a second port having first and second bitlines;
      wherein writes to the dual port dummy memory cell are performed on the first port and alternate between the first and the second bitlines of the first port on consecutive cycles; and
      write detection circuitry coupled to the dual port dummy memory cell and configured to detect when data has been written to the dual port dummy memory cell on either of the first or the second bitlines of the second port and responsively generate the signal.

2. The static random access memory of claim 1, wherein the signal generated by the write detection circuitry indicates a successful write operation to the dual port dummy memory cell.

3. The static random access memory of claim 1, wherein the additional column comprises at least one dual port off memory cell.

4. The static random access memory of claim 3, wherein a total number of dual port dummy memory cells and dual port off memory cells within the additional column is equivalent to a number of memory cells in one of a plurality of columns of the memory array.

5. The static random access memory of claim 1, wherein the additional column comprises a plurality of dual port dummy memory cells.

6. The static random access memory of claim 1, wherein the write detection circuitry comprises a toggle flip flop comprising first and second outputs, wherein the toggle flip flop receives an access signal, wherein the toggle flip flop provides a first output signal from the first output to write driver circuitry for the first bitline of the first port of the dual port dummy memory cell and provides a second output signal from the second output to write driver circuitry for the second bitline of the first port of the dual port dummy memory cell.

7. The static random access memory of claim 6, wherein the write detection circuitry comprises a multiplexer coupled to the first bitline and the second bitline of the second port of the dual port dummy memory cell, wherein the multiplexer is enabled according to the first output of the toggle flip flop.

8. The static random access memory of claim 7, wherein signals from the first bitline and the second bitline of the second port of the dual port dummy memory cell are inverted prior to being provided to the multiplexer.

9. The static random access memory of claim 8, wherein the first output of the toggle flip flop is not complemented and the second output of the toggle flip flop is complemented.

10. The static random access memory of claim 9, wherein data is written to the dual port dummy memory cell by alternating between pulling down the first bitline of the first port and pulling down the second bitline of the first port on consecutive write cycles.

11. The static random access memory of claim 1, wherein the plurality of columns and the write replica circuit share a common process variation.

12. A method of predicting a completed write operation within a static random access memory, the method comprising:
   providing at least one dual port dummy memory cell within an additional column of a memory array of the static random access memory;
   writing data to the dual port dummy memory cell by alternating between pulling down a first bitline of a first port of the dual port dummy memory cell and pulling down a second bitline of the first port on consecutive write cycles;
   detecting a transition in at least one of a first bitline or a second bitline of a second port of the dual port dummy memory cell; and
   turning off a word line of the static random access memory responsive to the detection.

13. The method of claim 12, further comprising:
   providing write detection circuitry coupled to the dual port dummy memory cell;
   wherein detecting the transition in at least one of the first bitline or the second bitline comprises generating a signal by the write detection circuitry when data has been written to the dual port dummy memory cell.

14. The method of claim 13, wherein the signal generated by the write detection circuitry indicates a successful write operation to the dual port dummy memory cell.

15. The method of claim 13, wherein providing the write detection circuitry comprises providing a toggle flip flop comprising first and second outputs, wherein the toggle flip flop receives an access signal, wherein the toggle flip flop provides a first output signal from the first output to write driver circuitry for the first bitline of the first port of the dual port dummy memory cell and provides a second output signal from the second output to write driver circuitry for a second bitline of the first port of the dual port dummy memory cell.

16. The method of claim 12, wherein providing the at least one dual port dummy memory cell comprises providing at least one dual port off memory cell.

17. The method of claim 12, wherein providing the at least one dual port dummy memory cell comprises providing a plurality of dual port dummy memory cells.

18. The method of claim 12, wherein providing the at least one dual port dummy memory cell comprises providing a total number of dual port dummy memory cells and dual port off memory cells within the additional column that is equivalent to a number of memory cells in one of a plurality of columns of the memory array.

19. The method of claim 18, wherein the plurality of columns and the additional column share a common process variation.

* * * * *